(12) United States Patent
Narazaki (10) Patent No.: US 8,593,167 B2
(45) Date of Patent: Nov. 26, 2013

(54) SEMICONDUCTOR DEVICE TEST METHOD AND APPARATUS, AND SEMICONDUCTOR DEVICE

(75) Inventor: Atsushi Narazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 290 days.

(21) Appl. No.: 13/042,600

(22) Filed: Mar. 8, 2011

(65) Prior Publication Data

US 2011/0298485 A1     Dec. 8, 2011

(30) Foreign Application Priority Data

Jun. 4, 2010   (JP) ................. 2010-128992

(51) Int. Cl.
  *G01R 31/02* (2006.01)
  *G01R 31/26* (2006.01)

(52) U.S. Cl.
  USPC ............ 324/762.01; 324/762.03; 324/762.05; 324/754.01; 324/754.03; 438/18

(58) Field of Classification Search
  USPC ............... 324/754.01, 762.01–762.06, 750.3, 324/754.03; 257/48; 438/18
  See application file for complete search history.

(56) References Cited

U.S. PATENT DOCUMENTS

| | | | |
|---|---|---|---|
| 6,268,717 B1 * | 7/2001 | Jarvis et al. | 324/750.02 |
| 6,777,966 B1 * | 8/2004 | Humphrey et al. | 324/754.07 |
| 7,700,944 B2 * | 4/2010 | Nishizawa | 257/48 |
| 2005/0194649 A1 * | 9/2005 | Oki | 257/409 |
| 2006/0076967 A1 | 4/2006 | Matsuda | |
| 2008/0128893 A1 * | 6/2008 | Uno | 257/700 |
| 2009/0201043 A1 * | 8/2009 | Kaltalioglu | 324/765 |

FOREIGN PATENT DOCUMENTS

| | | | | |
|---|---|---|---|---|
| JP | 03031894 A | * | 2/1991 | ............... G09G 3/36 |
| JP | 2001-33480 A | | 2/2001 | |
| JP | 2002-141474 | | 5/2002 | |
| JP | 2005-228854 | | 8/2005 | |
| KR | 10-2003-0011821 A | | 2/2003 | |
| KR | 10-2008-0049624 A | | 6/2008 | |

OTHER PUBLICATIONS

Office Action issued Aug. 28, 2012, in Korean Patent Application No. 10-2011-0052560 with partial English translation.
Office Action (with English translation) issued on May 4, 2013, in counterpart German Appln No. 10 2011 076 109.8 (14 pages).

* cited by examiner

*Primary Examiner* — Huy Q Phan
*Assistant Examiner* — James Split
(74) *Attorney, Agent, or Firm* — Oblon, Spivak, McClelland, Maier & Neustadt, L.L.P.

(57) ABSTRACT

A method of testing a semiconductor device includes a conductive foreign matter test step of measuring the resistance value between the first and second conductive patterns to determine whether conductive foreign matter is present between the first and second conductive patterns, a first open circuit test step of measuring the resistance value between two points on the first conductive pattern to determine whether there is an open circuit in the first conductive pattern, and a second open circuit test step of measuring the resistance value between two points on the second conductive pattern to determine whether there is an open circuit in the second conductive pattern. The measurement of the resistance value in each of the test steps is accomplished by pressing probes vertically against the first conductive pattern or the second conductive pattern or both.

4 Claims, 8 Drawing Sheets

SEMICONDUCTOR DEVICE TEST METHOD AND APPARATUS, AND SEMICONDUCTOR DEVICE

BACKGROUND OF THE INVENTION

1. Field of the Invention

The present invention relates to a semiconductor device having a plurality of conductive patterns and to a method and apparatus for testing the device.

2. Background Art

Some semiconductor devices have a guard ring structure designed to enhance the dielectric strength of the device. The guard ring structure includes a first conductivity type layer and a plurality of annular second conductivity type regions (i.e., guard rings) formed in the first conductivity type layer. Conductive patterns are formed on the guard rings to stabilize the potential of the guard rings. More specifically, each conductive pattern is formed on a respective one of the guard rings. The conductive patterns must be insulated from one another and must be free from open circuits or breaks.

Therefore, the manufacturing process of a semiconductor device includes a test process for determining whether the conductive patterns meet these requirements. An illustrative example of such a test process is described in Japanese Laid-Open Patent Publication No. 2002-141474. This publication discloses a test process for measuring electrical characteristics of the conductive patterns. Specifically, in this process, probe needles are pressed against pads formed on portions of the conductive patterns to measure electrical characteristics of the conductive patterns. It should be noted that these pads have a large surface area to facilitate the pressing of the probe needles against the pads.

The test process described in the above patent publication requires that the conductive patterns be provided with pads. It has been found, however, that this requirement may prevent the conductive patterns from having an optimum configuration for increasing the dielectric strength of the semiconductor device, making it impossible to sufficiently increase the dielectric strength of the device.

SUMMARY OF THE INVENTION

The present invention has been made to solve this problem. It is, therefore, an object of the present invention to provide a semiconductor device having a plurality of conductive patterns which have optimum configurations for increasing the dielectric strength of the device, yet which can be inspected without causing any problem. Another object of the present invention is to provide a method and apparatus for testing such a semiconductor device.

According to one aspect of the present invention, a method of testing a semiconductor device including a first conductive pattern formed on a guard ring and a second conductive pattern formed on another guard ring and insulated from the first conductive pattern, the method includes a conductive foreign matter test step of measuring the resistance value between the first and second conductive patterns to determine whether conductive foreign matter is present between the first and second conductive patterns, a first open circuit test step of measuring the resistance value between two points on the first conductive pattern to determine whether there is an open circuit in the first conductive pattern, and a second open circuit test step of measuring the resistance value between two points on the second conductive pattern to determine whether there is an open circuit in the second conductive pattern. The measurement of the resistance value in each of the test steps is accomplished by pressing probes vertically against the first conductive pattern or the second conductive pattern or both.

According to another aspect of the present invention, a semiconductor device includes an emitter pattern formed on a semiconductor substrate, a guard ring formed on the semiconductor substrate and encircling the emitter pattern, a conductive pattern formed on the guard ring, and an overcoating film covering the conductive pattern but exposing a portion of the top surface of the conductive pattern to the ambient atmosphere.

According to another aspect of the present invention, a semiconductor device includes an emitter pattern formed on a semiconductor substrate, a guard ring formed on the semiconductor substrate and encircling the emitter pattern, and a conductive pattern formed on the guard ring. A portion of the conductive pattern is thicker than other portions of the conductive pattern.

According to another aspect of the present invention, an apparatus for testing a semiconductor device by pressing a probe against a conductive pattern of the semiconductor device, the apparatus includes a probe, a spring attached to the probe so as to reduce the force with which the probe is pressed against the conductive pattern, and a measurement unit electrically connected to the probe and for measuring electrical characteristics of the conductive pattern.

According to another aspect of the present invention, an apparatus for testing a semiconductor device by pressing a probe against a conductive pattern of the semiconductor device, the apparatus includes a probe having a flattened distal end which is to be pressed against the conductive pattern, and a measurement unit electrically connected to the probe and for measuring electrical characteristics of the conductive pattern.

Other and further objects, features and advantages of the invention will appear more fully from the following description.

DETAILED DESCRIPTION OF THE PREFERRED EMBODIMENTS

First Embodiment

Figure 1:
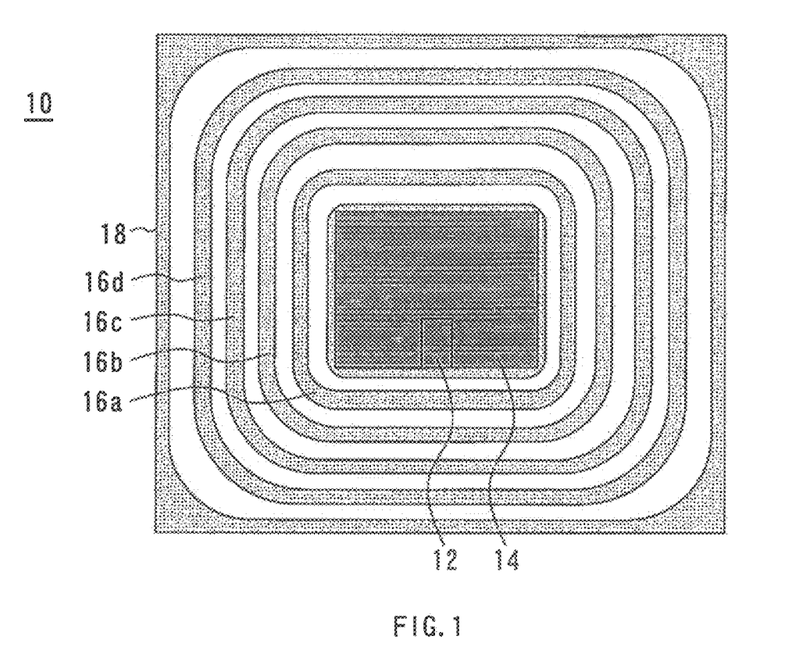
FIG. 1 is a plan view of a semiconductor device.

There will now be described a method of testing a semiconductor device in accordance with a first embodiment of the present invention. FIG. 1 is a plan view of a semiconductor device 10. This semiconductor device 10 is an IGBT formed on a semiconductor substrate. A gate electrode 12 and an emitter electrode 14 are formed at the center of the semiconductor device 10. Conductive patterns 16a, 16b, 16c, and 16d are formed to encircle the gate electrode 12 and the emitter electrode 14. The conductive patters 16a, 16b, 16c, and 16d are made of aluminum. They are insulated from one another. A channel stopper electrode 18 is formed to encircle the conductive patterns 16a, 16b, 16c, and 16d.

Figure 2:
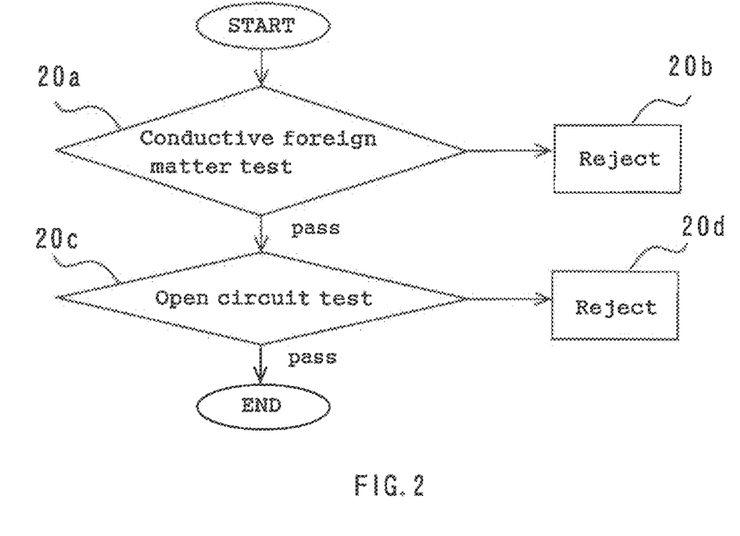
FIG. 2 is a flowchart showing the method of testing a semiconductor device in accordance with the first embodiment.

FIG. 2 is a flowchart showing the method of testing a semiconductor device in accordance with the first embodiment. The method begins by performing a conductive foreign matter test process (step 20a). This conductive foreign matter test process is used to determine whether any conductive foreign matter is attached to the conductive patterns 16a, 16b, 16c, and 16d.

Figure 3:
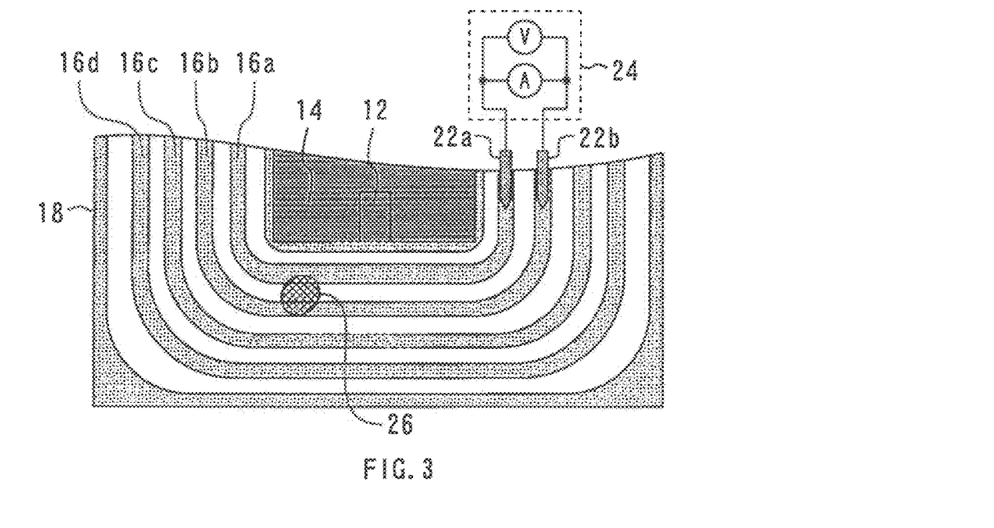
FIG. 3 is a schematic diagram illustrating the conductive foreign matter test process.

FIG. 3 is a schematic diagram illustrating the conductive foreign matter test process. In this process, first, probes 22a and 22b are pressed against the conductive patterns 16a and 16b, respectively. It should be noted that the probes 22a and 22b are pressed vertically, or perpendicularly, against the conductive patterns 16a and 16b. The probes 22a and 22b are connected to a measuring unit 24. The measurement unit 24 includes an ammeter and a voltmeter and is adapted to measure the resistance value between the probes 22a and 22b. The resistance value between the conductive patterns 16a and 16b is then measured by use of the measurement unit 24 and the probes 22a and 22b. When the conductive patterns 16a and 16b are properly insulated from each other, the resistance value therebetween, as obtained by this process, is very high. However, if, for example, there is a conductive foreign matter 26 attached to and connecting between the conductive patterns 16a and 16b (as shown in FIG. 3), the resistance value between these conductive patterns is low.

This conductive foreign matter test process also measures the resistance values between the conductive patterns 16b and 16c and between the conductive patterns 16c and 16d in the same manner as between the conductive patterns 16a and 16b. If any one of these resistance values is lower than a predetermined value, then the semiconductor device 10 is rejected (step 20b) on the assumption that conductive foreign matter is attached to the device.

Figure 4:
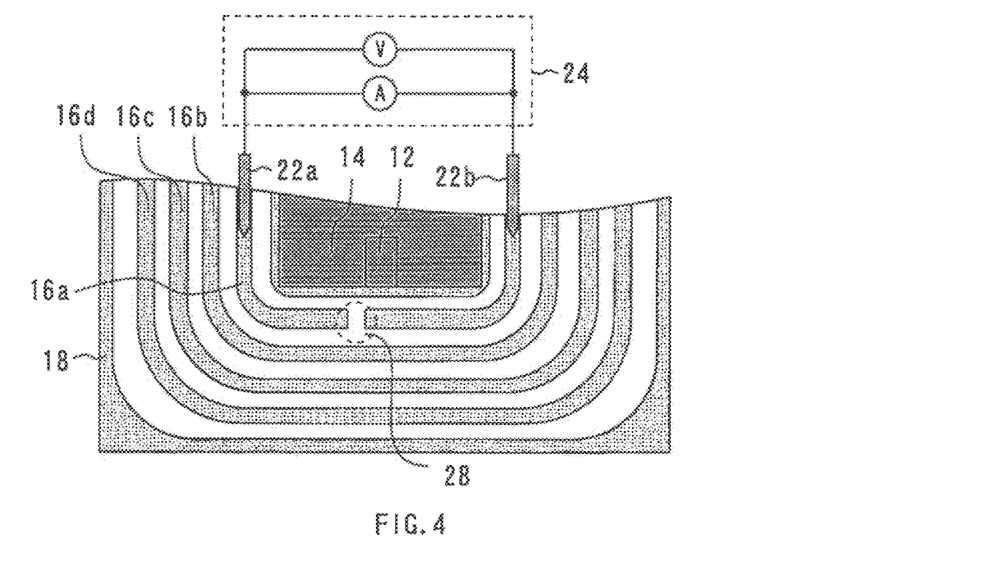
FIG. 4 is a schematic diagram illustrating the open circuit test process.

If all of the above resistance values obtained by the conductive foreign matter test process are higher than the predetermined value, then it is determined that no conductive foreign matter is attached to the semiconductor device 10, and the method proceeds to an open circuit test process (step 20c). This open circuit test process is used to determine whether there is an open circuit, or break, in the conductive patterns 16a, 16b, 16c, and 16d. FIG. 4 is a schematic diagram illustrating the open circuit test process. In this process, first, the probes 22a and 22b are pressed against the conductive pattern 16a at different points. It should be noted that the probes 22a and 22b are pressed vertically against the conductive pattern 16a.

The resistance value between the two points on the conductive pattern 16a is then measured by use of the measurement unit 24 and the probes 22a and 22b. When there is no open circuit, or break, in the conductive pattern 16a, the resistance value between the two points, as obtained by this process, is low. However, if, for example, there is an open circuit 28 in the conductive pattern 16a (as shown in FIG. 4), the resistance value is high. It should be noted that since the conductive pattern 16a is annular in shape, as shown in FIG. 1, the points at which the probes 22a and 22b are pressed against the conductive pattern 16a are connected to each other by two opposite semi-annular portions of the conductive pattern 16a. This means that if there is an open circuit in both of these semi-annular portions, the resistance value between the two points on the conductive pattern 16a is very high.

This open circuit test process also tests the conductive patterns 16b, 16c, and 16d in the same manner as the conductive pattern 16a. If any one of the resistance values obtained by this process is higher than a predetermined value, then the semiconductor device 10 is rejected (step 20d) on the assumption that there is an open circuit in at least one of the conductive patterns. In the method of testing a semiconductor device in accordance with the first embodiment, the probes are pressed directly against the conductive patterns, thus eliminating the need for the conductive patterns to be provided with pads. Thus the first embodiment allows the conductive patterns to have optimum configurations for increasing the dielectric strength of the semiconductor device, as well as allowing these conductive patterns to be tested for the presence of conductive foreign matter and open circuits.

Figure 5A:
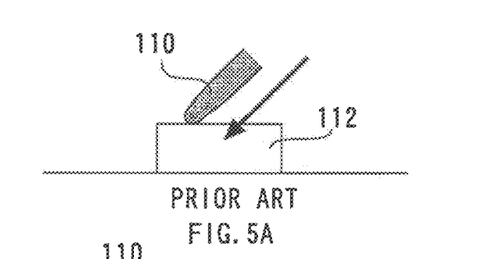
FIGS. 5A and 5B is a diagram illustrating the comparative conventional test method.
Figure 5B:
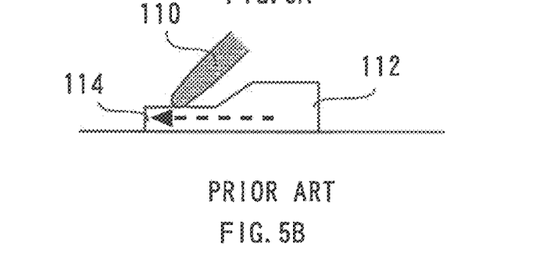

Further, in the method of testing a semiconductor device in accordance with the first embodiment, probes are pressed vertically against conductive patterns in each test process. To facilitate the understanding of the advantages of this feature, the following describes a comparative conventional test method. FIG. 5 is a diagram illustrating this test method. In this method, a probe 110 is pressed against a conductive pattern 112 of aluminum at an oblique angle. More specifically, for example, the probe 110 is pressed against the conductive pattern 112 in the direction of the arrow in FIG. 5A. It should be noted that since the conductive pattern 112 generally does not have as much surface area as pads, the pattern 112 readily slides or stretches over the substrate when pressed in a direction that is not normal to its surface (as indicated by the dashed arrow in FIG. 5B). Such sliding of aluminum patterns is referred to as "aluminum sliding." In the comparative conventional test method, aluminum sliding may occur which results in the formation of, e.g., a stretched portion 114 (see FIG. 5B), thus distorting the configuration of the conductive pattern.

In the method of testing a semiconductor device in accordance with the first embodiment, on the other hand, the probes are pressed vertically against the conductive patterns. In this way aluminum sliding can be avoided although the probes are pressed directly against the conductive patterns.

Figure 6:
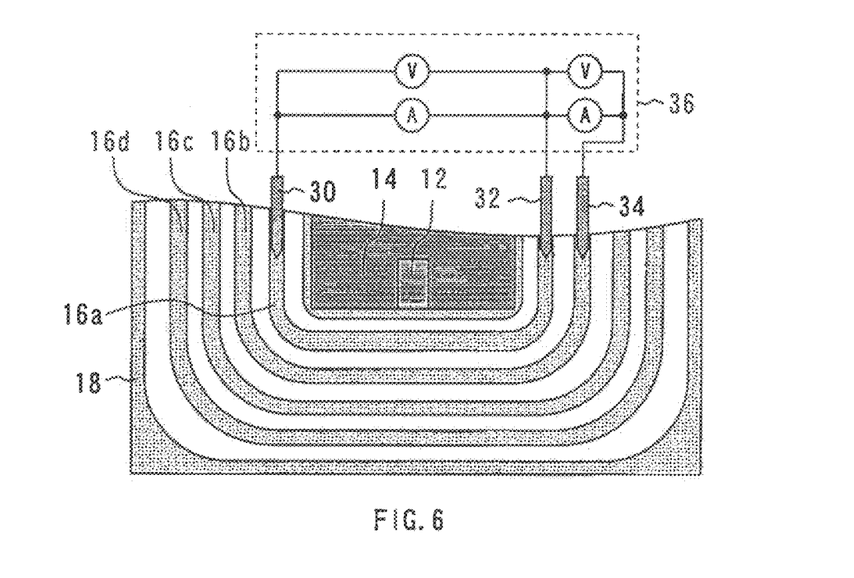
FIG. 6 is a schematic diagram showing a method of performing the conductive foreign matter test process and the open circuit test process at the same time.

Various alterations may be made to the method of testing a semiconductor device in accordance with the first embodiment. For example, it is possible to perform the conductive foreign matter test process and the open circuit test process simultaneously. FIG. 6 is a schematic diagram showing a method of performing the conductive foreign matter test process and the open circuit test process at the same time. Probes 30 and 32 are pressed against the conductive pattern 16a at different points, and a probe 34 is pressed against the conductive pattern 16b. The measurement unit, 36, is adapted to measure the resistances between the probes 30 and 32 and between the probes 32 and 34. With this arrangement, the open circuit test process may be performed by measuring the resistance value between the probes 30 and 32, while at the same time the conductive foreign matter test process may be performed by measuring the resistance value between the probes 32 and 34 in order to reduce the total test time.

Figure 7:
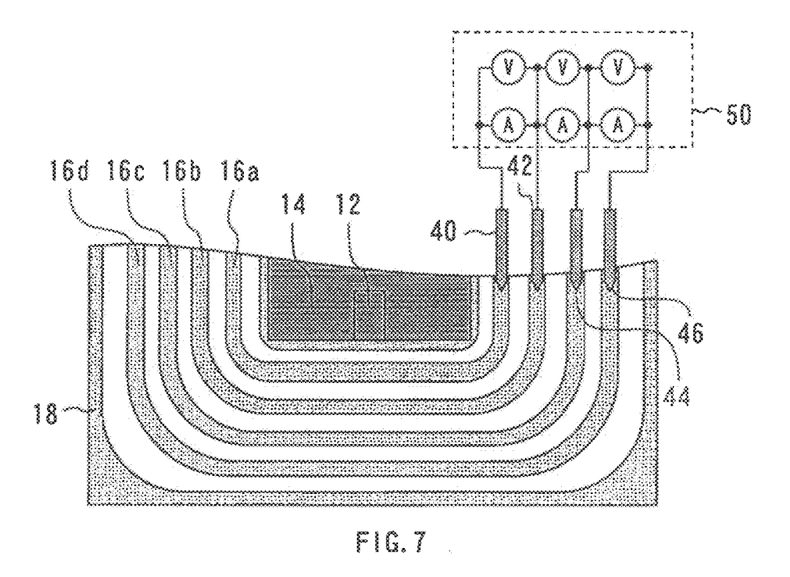
FIG. 7 is a schematic diagram illustrating a method of accomplishing the entire conductive foreign matter test process in a single measuring operation.

Further, all the conductive patterns may be simultaneously pressed against by probes to carry out the entire conductive foreign matter test process in a single measuring operation. FIG. 7 is a schematic diagram illustrating a method of accomplishing the entire conductive foreign matter test process in a single measuring operation. In this method, probes 40, 42, 44, and 46 are pressed against the conductive patterns 16a, 16b, 16c, and 16d, respectively. Further, the measurement unit, 50, is adapted to measure the resistances between the probes 40 and 42, between the probes 42 and 44, and between the probes 44 and 46. This allows the entire conductive foreign matter test process to be performed in a single measuring operation, thereby reducing the total test time.

Figure 8:
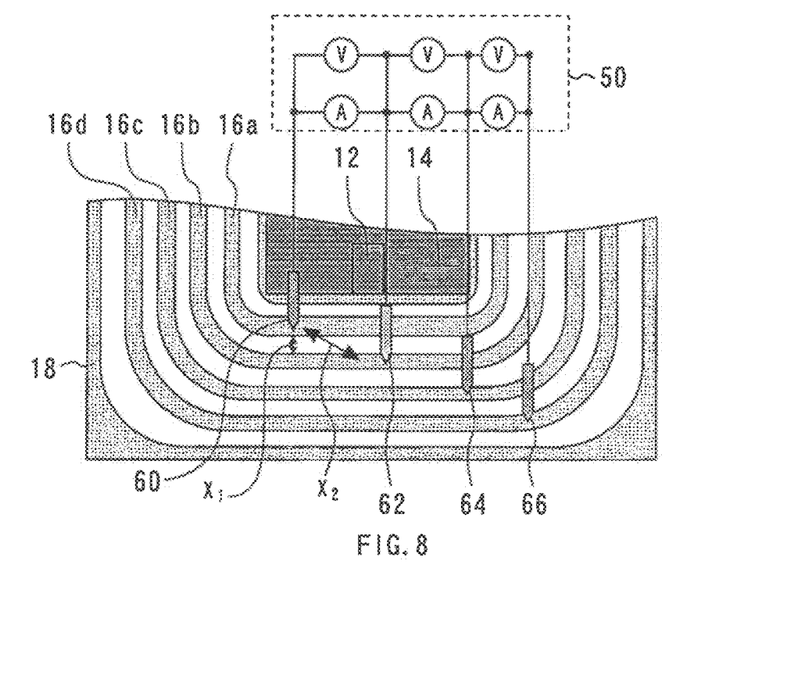
FIG. 8 is a schematic diagram illustrating a method of testing a semiconductor device, wherein probes are pressed against conductive patterns at points which are spaced a relatively great distance from each other.

Further, the points at which the probes are pressed against conductive patterns during each test process may be spaced from each other a greater distance than in the above example shown in FIG. 7. FIG. 8 is a schematic diagram illustrating a method of testing a semiconductor device, wherein probes are pressed against conductive patterns at points which are spaced a relatively great distance from each other. Referring to FIG. 8, a probe 62 is pressed against the conductive pattern 16b at a point spaced a distance of X2 from the point at which a probe 60 is pressed against the conductive pattern 16a. (In FIG. 8, symbol X1 represents the closest possible distance between the probes 60 and 62.) Since the probes can be thus spaced from each other, it is possible to prevent their contact even if the conductive patterns are arranged close to one another.

It should be noted that the present embodiment may be used to test any suitable semiconductor device having conductive patterns formed therein, regardless of its material and use. For example, the above test method may be applied to testing of other semiconductor devices such as diodes and MOSFETs in which conductive patterns are formed on a guard ring structure. Further, the above method may be used to test semiconductor devices which include conductive patterns serving as field plates or wiring patterns.

The resistance values obtained by the above method may be used to determine conditions of the semiconductor device other than the presence of conductive foreign matter and open circuits. For example, in the case of a semiconductor device in which a barrier metal is formed under conductive patterns of TiN, etc., the present embodiment may be used to inspect the device for residual barrier metal material.

In the method of testing a semiconductor device in accordance with the first embodiment, the semiconductor device may be tested for other conditions in addition to the presence of conductive foreign matter and open circuits. For example, the measurement unit may include a high accuracy ammeter to test the device for leakage currents between the guard rings and the conductive patterns. The values of the leakage currents, as measured by the measurement unit, may be used to verify the validity of the guard ring pattern design. Further, it is possible to detect guard ring junction leakage currents and thereby perform failure analysis of the semiconductor device.

Further, the measurement unit may include a high accuracy voltmeter to test the dielectric strength between the guard rings and the conductive patterns in order to verify the validity of the guard ring pattern design. It is also possible to measure the dielectric strength of the junctions between guard rings and the adjacent diffusion layer and thereby perform failure analysis of the semiconductor device.

Further, the measurement unit may include a high accuracy capacitance meter and measure the capacitance of the depletion layer adjacent the guard rings in order to verify the guard ring pattern design. It is also possible to perform failure analysis of the semiconductor device by observing the conditions of the depletion layer adjacent the guard rings.

Second Embodiment

Figure 9:
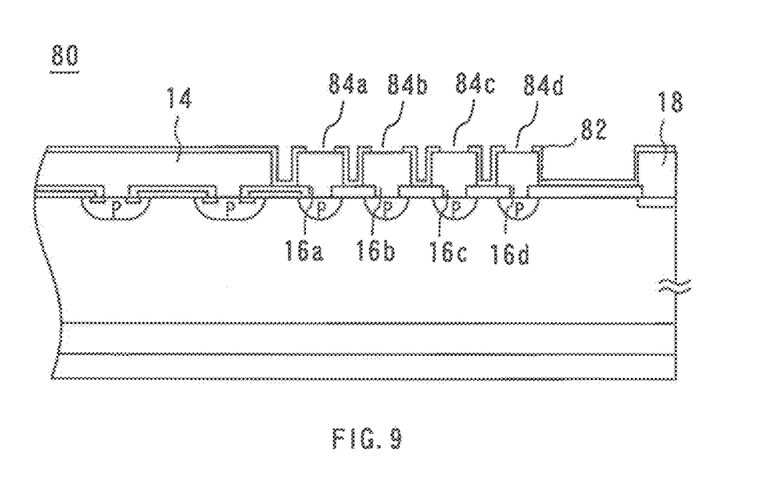
FIG. 9 is a cross-sectional view of the semiconductor device of the second embodiment.

A semiconductor device in accordance with a second embodiment of the present invention is characterized in that an overcoating film having openings is formed on the conductive patterns. An overcoating film is a high resistance film formed on a conductive pattern or patterns The overcoating film serves to stabilize the dielectric strength of the semiconductor device. FIG. 9 is a cross-sectional view of the semiconductor device of the second embodiment. The semiconductor device, 80, includes an emitter electrode 14 and an overcoating film 82 covering the conductive patterns 16a, 16b, 16c, and 16d and the channel stopper electrode 18. The overcoating film 82 has openings 84a, 84b, 84c, and 84d exposing portions of the top surfaces of the conductive patters 16a, 16b, 16c, and 16d, respectively.

Figure 10:
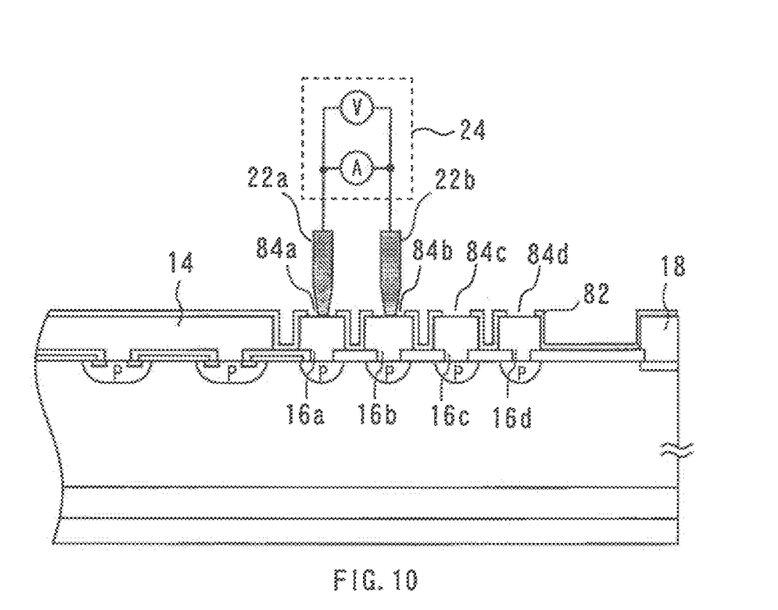
FIG. 10 is a diagram illustrating the test processes for the semiconductor device in accordance with the second embodiment.

The semiconductor device 80 thus constructed is subjected to a conductive foreign matter test process and an open circuit test process (which may be hereinafter referred to collectively as the test processes). FIG. 10 is a diagram illustrating the test processes for the semiconductor device in accordance with the second embodiment. A probe 22a is passed through the opening 84a and pressed against the exposed surface of the conductive pattern 16a. Further, a probe 22b is passed through the opening 84b and pressed against the exposed surface of the conductive pattern 16b. Except for this feature, the test processes are similar to the test method of the first embodiment.

Thus, the construction of the semiconductor device 80 of the second embodiment allows the test processes to be performed after the formation of the overcoating film, making it possible to detect conductive foreign matter and open circuits originating in the overcoating film forming process. Further, since the openings 84a, 84b, 84c, and 84d of the overcoating film only partially expose the top surfaces of the conductive patterns, this overcoating film has substantially the same effect as would a overcoating film covering the entire surface of the semiconductor device.

Third Embodiment

Figure 11:
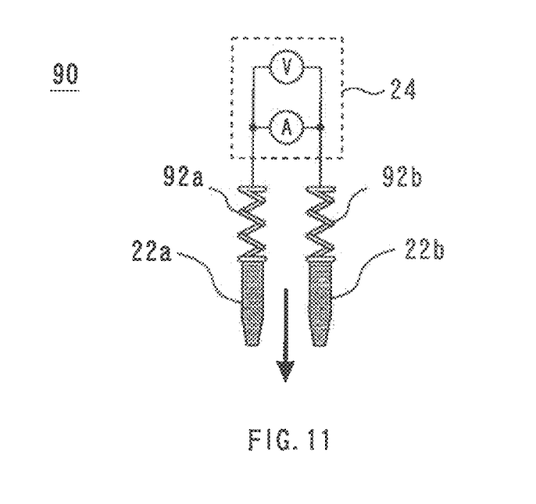
FIG. 11 is a schematic diagram showing the test apparatus of the third embodiment.

An apparatus for testing a semiconductor device in accordance with a third embodiment of the present invention is characterized in that its probes are provided with a spring. FIG. 11 is a schematic diagram showing the test apparatus of the third embodiment. The test apparatus, 90, includes a spring 92a and a spring 92b. The springs 92a and 92b are attached to the probes 22a and 22b, respectively, so that the springs 92a and 92b can be expanded and contracted in the direction in which the probes 22a and 22b are pressed against conductive patterns (i.e., in the direction of the arrow in FIG. 11).

The measurement unit 24 of the test apparatus 90 is adapted to measure the resistance between the probes 22a and 22b by use of an ammeter and a voltmeter. This test apparatus 90 is used to perform test processes such as described above.

Incidentally, the positions of the top surfaces of the conductive patterns may vary due to variations in the thickness of the conductive patterns and due to irregularities in the surface of the underlying layer. As a result, the probes may not be able to be brought into contact with the top surfaces of the conductive patterns, or the probes may be pressed against the conductive patterns with excessive force. In the former case it is not possible to perform a proper test process, while in the latter case the conductive patterns might be damaged by the excessive force.

The test apparatus 90 of the third embodiment avoids this problem by having the springs 92a and 92b, which are deformed so as to accommodate the variations in the positions of the top surfaces of the conductive patterns against which the probes 22a and 22b are pressed. That is, these springs 92a and 92b act to allow the probes to be brought into contact with the top surfaces of the conductive patterns even if these top surfaces are lower than their desired height, and also act to reduce the force with which the probes are pressed against the top surfaces of the conductive patterns if these top surfaces are higher than their desired height.

Although in the present embodiment the test apparatus 90 includes the coil springs 92a and 92b, it is to be understood that the present invention is not limited to coil springs. Leaf springs may be used instead of the coil springs. Further, in accordance with the present invention, it is possible to use any suitable member which can be expanded and contracted in the direction in which the probes are pressed against the conductive patterns.

Fourth Embodiment

Figure 12:
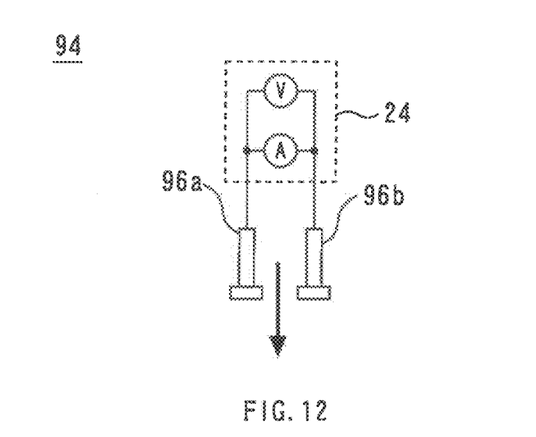
FIG. 12 is a schematic diagram showing the test apparatus of the fourth embodiment.

An apparatus for testing a semiconductor device in accordance with a fourth embodiment of the present invention is characterized in that the distal ends of its probes are flattened. FIG. 12 is a schematic diagram showing the test apparatus of the fourth embodiment. The test apparatus, 94, includes a probe 96a and a probe 96b. The probes 96a and 96b each have a flattened distal end which is to be pressed against a conductive pattern (in the direction of the arrow in FIG. 12). This test apparatus 90 is used to perform test processes such as described above.

It has been found that the use of pointed probes in a test process such as described above is disadvantageous in that the conductive patterns might be deformed when the probes are pressed against them. Since, in accordance with the present invention, the conductive patterns are not provided with pads, probes are directly pressed against the conductive patterns, which are relatively narrow. Therefore, in the present invention, the conductive patterns tend to be deformed by probes, especially pointed probes, as compared to when probes are pressed against pads of conductive patterns. It will be noted that deformation of the conductive patterns of a semiconductor device may prevent the device from having the desired dielectric strength.

The test apparatus 94 of the fourth embodiment avoids this deformation of the conductive patterns by using the probes 96a and 96b having flattened distal ends, which are brought into surface contact with the surfaces of the conductive patterns.

Figure 13:
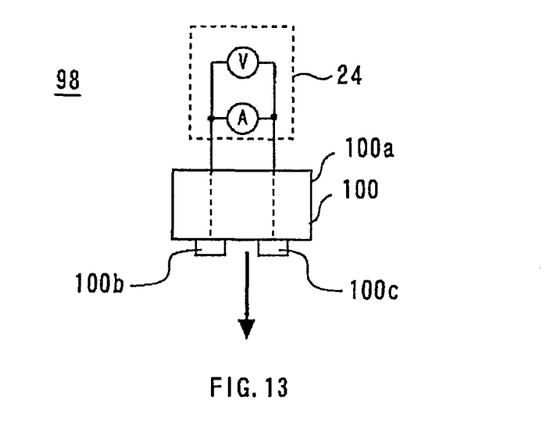
FIG. 13 is a diagram showing a variation of the test apparatus of the fourth embodiment.

FIG. 13 is a diagram showing a variation of the test apparatus of the fourth embodiment. This test apparatus, 98, includes a probe 100 having a plate 100a. The plate 100a has probe electrodes 100b and 100c thereon. These probe electrodes 100b and 100c are formed by first forming a solid pattern over the surface of the plate 100a and then etching the pattern. The distal ends of the probe electrodes 100b and 100c are flattened, thereby preventing the above described deformation of the conductive patterns in the test processes. Further, it is easy to etch the probe electrodes 100b and 100c so that they have a small surface area. This means that these probe electrodes can be processed to have a surface area small enough to match the dimensions of the conductive patterns even if the conductive patterns are arranged at close intervals. It should be noted that the probe electrodes 100b and 100c may be formed by sputtering.

Fifth Embodiment

Figure 14:
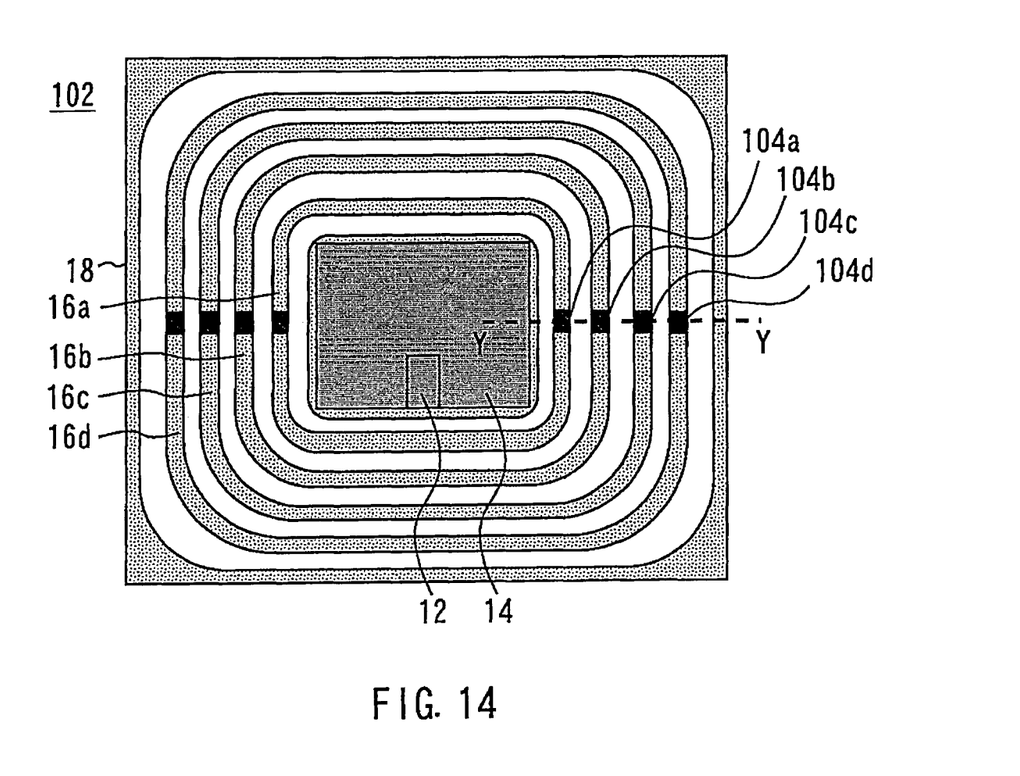
FIG. 14 is a plan view of semiconductor device of fifth embodiment.
Figure 15:
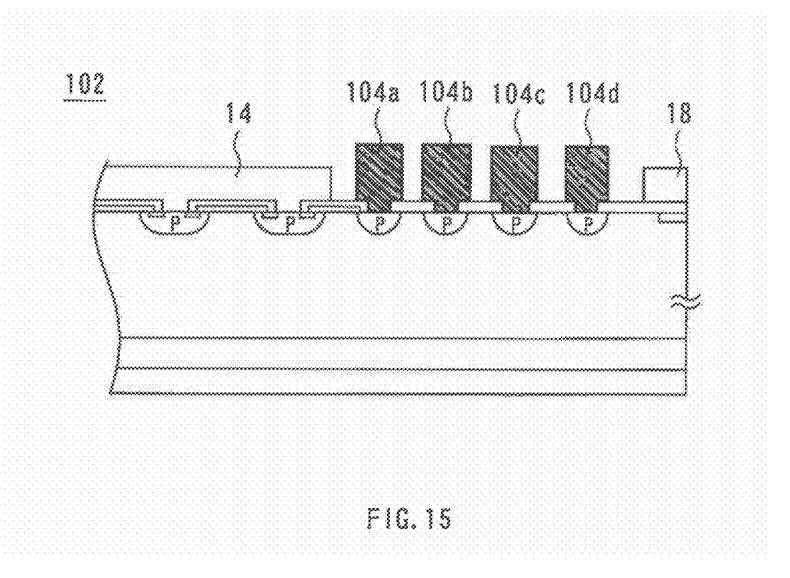
FIG. 15 is a cross-sectional view taken along dashed line Y-Y of FIG. 14.

A semiconductor device in accordance with a fifth embodiment of the present invention is characterized in that some portions of its conductive patterns are thicker than other portions. FIG. 14 is a plan view of this semiconductor device 102. In the semiconductor device 102, the conductive pattern 16a has a thick portion 104a. Further, the conductive patterns 16b, 16c, and 16d also have thick portions 104b, 104c, and 104d, respectively. FIG. 15 is a cross-sectional view taken along dashed line Y-Y of FIG. 14. That is, FIG. 15 shows cross-sections of thick portions of the conductive patterns.

In the test processes, probes are pressed against the thick portions of conductive patterns to avoid damage to the layer underlying the conductive patterns. This also prevents deformation of the conductive patterns.

Thus the present invention allows the conductive patterns of a semiconductor device to have optimum configurations for increasing the dielectric strength of the device, as well as allowing these conductive patterns to be inspected without causing any problem.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-128992, filed on Jun. 4, 2010 including specification, claims, drawings and summary, on which the Convention priority of the present application is based, are incorporated herein by reference in its entirety.

What is claimed is:

1. A method of testing a semiconductor device including a first conductive pattern formed on a guard ring and a second conductive pattern formed on another guard ring and insulated from said first conductive pattern, said method comprising:

a conductive foreign matter test step of measuring the resistance value between said first and second conductive patterns to determine whether conductive foreign matter is present between said first and second conductive patterns;

arbitrarily selecting any two first conductive pattern points from a continuum of first conductive pattern points that all together form said first conductive pattern and performing a first open circuit test step of measuring the resistance value between the two arbitrarily selected first conductive pattern points on said first conductive pattern to determine whether there is an open circuit in said first conductive pattern; and arbitrarily selecting any two second conductive pattern points from a continuum of second conductive pattern points that all together form said second conductive pattern and performing a second open circuit test step of measuring the resistance value between the two arbitrarily selected second conductive pattern points on said second conductive pattern to determine whether there is an open circuit in said second conductive pattern, wherein said measurement of said resistance value in each of said test steps is accomplished by pressing probes vertically against said first conductive pattern or said second conductive pattern or both.

2. The method according to claim 1, wherein:

said probes are pressed against conductive patterns at points such that contact between said probes is prevented in each of said test steps.

3. The method according to claim 1, wherein:

said probes are provided with a spring.

4. The method according to claim 1, wherein:

said probes are provided with flattened distal ends.

* * * * *